United States Patent
Byun et al.

(10) Patent No.: US 7,436,266 B2
(45) Date of Patent: Oct. 14, 2008

(54) LC QUADRATURE VCO HAVING STARTUP CIRCUIT

(75) Inventors: Sang-Jin Byun, Daejon (KR); Cheon-Soo Kim, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 111 days.

(21) Appl. No.: 11/644,506

(22) Filed: Dec. 22, 2006

(65) Prior Publication Data
US 2008/0079508 A1   Apr. 3, 2008

(30) Foreign Application Priority Data
Sep. 29, 2006   (KR) .................. 10-2006-0095677

(51) Int. Cl.
*H03B 5/12* (2006.01)
(52) U.S. Cl. .................. 331/117 R; 331/45; 331/46
(58) Field of Classification Search ............. 331/117 R, 331/45, 46
See application file for complete search history.

(56) References Cited

U.S. PATENT DOCUMENTS

| 6,812,798 | B1 | 11/2004 | Hsiao |
| 6,970,048 | B1 | 11/2005 | Devnath et al. |
| 7,075,377 | B2 * | 7/2006 | Metaxakis .................. 331/46 |
| 2002/0039052 | A1 | 4/2002 | Straub et al. |
| 2005/0129157 | A1 * | 6/2005 | Ashida ..................... 375/371 |
| 2005/0275469 | A1 | 12/2005 | Metaxakis |
| 2008/0079504 | A1 * | 4/2008 | Byun et al. ................. 331/45 |

FOREIGN PATENT DOCUMENTS

| KR | 1020000023315 | 4/2000 |
| KR | 1020030055429 | 8/2003 |
| KR | 1020030058741 | 8/2003 |
| KR | 1020040011742 | 2/2004 |
| KR | 1020060047261 | 5/2006 |
| KR | 100602192 | 7/2006 |

OTHER PUBLICATIONS

Li, Shenggao, et al., "A 10-GHz CMOS Quadrature LC-VCO for Multirate Optical Applications", Oct. 2003, *IEEE Journal of Solid-State Circuits*, vol. 38, No. 10.
Notice of Korean Patent Grant dated Oct. 26, 2007 for the corresponding application KR 10-2006-0095677.

* cited by examiner

*Primary Examiner*—Joseph Chang
(74) *Attorney, Agent, or Firm*—Ladas & Parry LLP

(57) ABSTRACT

Provided is an Inductor-Capacitor (LC) quadrature Voltage Controlled Oscillator (VCO) having a startup circuit which can accurately select one of +90° and −90° as a phase difference between two clocks generated by the LC quadrature VCO by embodying the startup circuit therein by using a phase detector and a controller. The LC quadrature VCO includes a first LC tank for generating a second clock signal and a fourth clock signal, a second LC tank for generating a first clock signal and a third clock signal, a phase detector for receiving the clock signals from the first LC tank and the second LC tank, and detecting whether a phase difference between the clocks is +90° or −90°, and a controller for discriminating whether phase information detected by the phase detector is equivalent to a phase difference between clocks required by the external signal processing unit, and changing an operation mode of the first LC tank and/or the second LC tank on the basis of the discrimination result of the phase difference between the clocks.

7 Claims, 4 Drawing Sheets

<Phase detector>

LC QUADRATURE VCO HAVING STARTUP CIRCUIT

FIELD OF THE INVENTION

The present invention relates to an Inductor-Capacitor (LC) quadrature Voltage Controlled Oscillator (VCO) (so-called "4-phase VCO"); and, more particularly, to an LC quadrature VCO having a startup circuit which can accurately select one of +90° and −90° as a phase difference between two clocks generated by the LC quadrature VCO by embodying the startup circuit therein by using a phase detector and a controller.

DESCRIPTION OF RELATED ART

In general, an LC quadrature VCO generates clocks having a phase difference of 90°, for example, clocks of 0°, 90°, 180° and 270° through two LC tanks or resonators provided therein.

This LC quadrature VCO has two operation modes. The first operation mode generates clocks with a phase difference of +90° in the VCO, and the second operation mode generates clocks with a phase difference of −90° therein.

The LC quadrature VCO having the two operation modes as mentioned above will now be described with reference to FIGS. 1 and 2.

FIG. 1 is a circuit diagram illustrating a structure of a general LC quadrature VCO, and FIG. 2 is a schematic circuit diagram of the LC quadrature VCO shown in FIG. 1 for linear analysis.

Referring to FIG. 1, the general LC quadrature VCO includes two LC tanks, for example, a first LC tank 110 and a second LC tank 120. Clocks having a phase difference of ±90°, for example, CLK0, CLK90, CLK180 and CLK270 are generated from output terminals of the first LC tank 110 and the second LC tank 120, respectively.

The LC quadrature VCO shown in FIG. 1 has the basic structure. A resonant frequency of the LC quadrature VCO itself is different from that of each of the two LC tanks, and, for example, is determined as a slightly moved frequency in proportion to a coupling strength between the first and the second LC tanks 110 and 120.

Meanwhile, FIG. 2 is a schematic circuit diagram of the LC quadrature VCO shown in FIG. 1 for linear analysis. If the phase difference between the clock generated by the first LC tank 110 and the clock generated by the second LC tank 120 is defined as 'θ', the phase sum of the clocks in the loop is '2θ+π', wherein 'θ' may be represented as:

$$2\theta + \pi = 2n\pi \text{ (where } n \text{ is an integer)} \quad \text{Eq. (1)}$$

$$\theta = n\pi - \pi/2 \text{ (where } n \text{ is an integer)} \quad \text{Eq. (2)}$$

$$\theta = +\pi/2 \, (+90°) \text{ or } -\pi/2(-90°) \quad \text{Eq. (3)}$$

As can be seen from Eq. (3), the phase difference θ between the clock generated by the first LC tank 110 and the clock generated by the second LC tank 120 is one of +90° and −90°, which mean the two operation modes described above.

On the other hand, a clock recovery circuit, a data recovery circuit and an image rejection circuit perform their respective functions on the basis of the phase difference between the clocks generated by the LC quadrature VCO.

However, since the general LC quadrature VCO randomly selects the two operation modes of generating the clocks with the phase difference of +90° or −90°, the phase difference between the clock generated by the first LC tank 110 and the clock generated by the second LC tank 120 may be different from the phase difference between the clocks required by the clock recovery circuit, the data recovery circuit and the image rejection circuit.

One of prior arts to solve the foregoing problems is U.S. Pat. No. 6,970,048, entitled "Inductive-Capacitive (LC) Based Quadrature Voltage Controlled Oscillator (VCO) with Deterministic Quadrature Signal Phase Relationship."

In this prior art, two identical phase shifters are interposed between a first LC tank and a second LC tank, respectively, for selecting one of +90° and −90° as a phase difference between two clocks.

However, a phase error is caused by the phase shifters additionally provided in the LC quadrature VCO and added to the phase difference between the clocks generated in the LC quadrature VCO itself, thereby making it difficult to accurately select +90° or −90° as the phase difference between the two clocks.

Therefore, there have been increasing demands for a technique of accurately selecting one of +90° and −90° as the phase difference between the two clocks generated in the LC quadrature VCO implemented by the two LC tanks.

SUMMARY OF THE INVENTION

It is, therefore, a primary object of the present invention to provide an LC quadrature VCO having a startup circuit which can accurately select one of +90° and −90° as a phase difference between two clocks generated by the LC quadrature VCO by embodying the startup circuit therein by using a phase detector and a controller.

In accordance with the present invention, there is provided an LC quadrature VCO for supplying clock signals having a phase difference of ±90° to an external signal processing apparatus, the LC quadrature VCO having a startup circuit, including: a first LC tank for generating a second clock signal and a fourth clock signal; a second LC tank for generating a first clock signal and a third clock signal; a phase detector for receiving the clock signals from the first LC tank and the second LC tank, and detecting whether the phase difference between the clocks is +90° or −90°; and a controller for discriminating whether phase information detected by the phase detector is equivalent to a phase difference between clocks requested by the external signal processing apparatus, and changing an operation mode of the first LC tank and/or the second LC tank on the basis of the discrimination result of the phase difference between the clocks.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

The above-mentioned objectives, features, and advantages will be more apparent by the following detailed description associated with the accompanying drawings, and thus, a person skilled in the art will easily carry out the present invention. Further, in the following description, well-known arts will not be described in detail if it appears that they could obscure the invention in unnecessary detail. Hereinafter, preferred embodiments of the present invention will be set forth in detail with reference to the accompanying drawings.

As will be described below, the present invention embodies a startup circuit in an LC quadrature VCO by using a phase detector and a controller so as to accurately select one of +90° and −90° as a phase difference between two clocks generated by the LC quadrature VCO implemented by two LC tanks.

That is, in order to generate a phase difference between clocks required by a clock recovery circuit, a data recovery circuit and an image rejection circuit in the LC quadrature VCO, the startup circuit proposed by the present invention repeatedly detects and discriminates a phase difference between clocks generated by a first LC tank and a second LC tank, and selects one of two operation modes by controlling turning on/off operations of the first LC tank and/or the second LC tank based on the discrimination result. Accordingly, the phase difference between the two clocks is accurately selected as +90° or −90°.

Now, the LC quadrature VCO having the startup circuit in accordance with the present invention will be described with reference to FIGS. 3 to 7.

Figure 1:
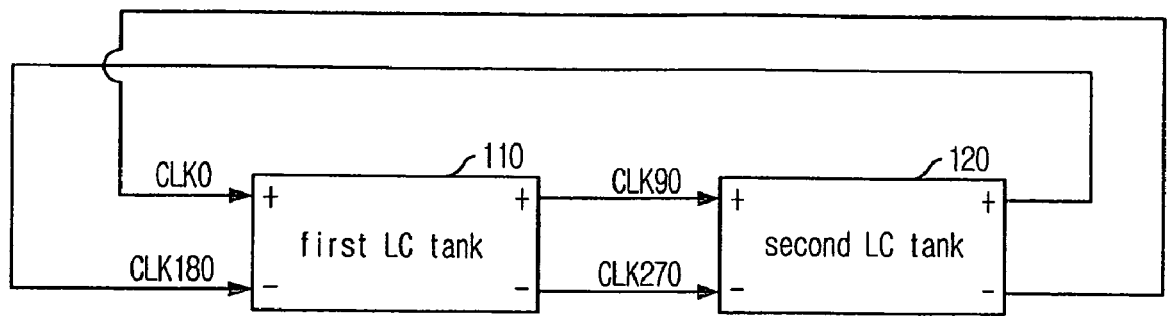
FIG. 1 is a circuit diagram illustrating a structure of a general LC quadrature VCO.
Figure 2:
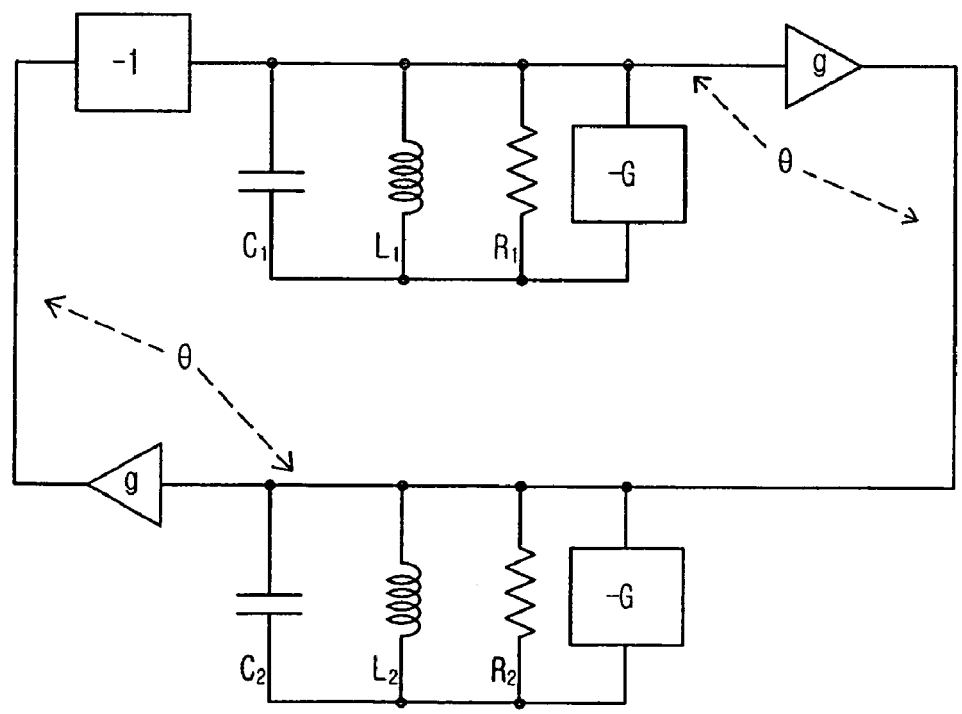
FIG. 2 illustrates a schematic circuit diagram of the LC quadrature VCO shown in FIG. 1 for linear analysis.
Figure 3:
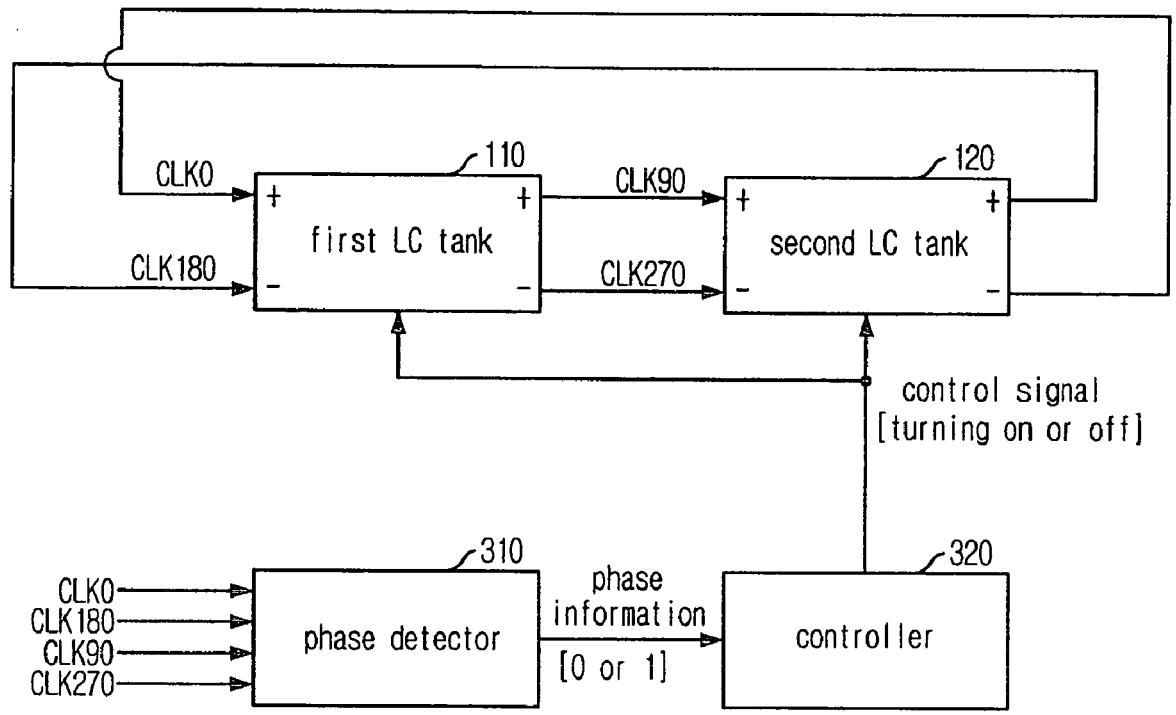
FIG. 3 is a block diagram illustrating a configuration of an LC quadrature VCO having a startup circuit in accordance with a preferred embodiment of the present invention.

FIG. 3 is a block diagram illustrating a configuration of the LC quadrature VCO having the startup circuit in accordance with a preferred embodiment of the present invention.

As illustrated therein, the LC quadrature VCO having the startup circuit of the present invention basically includes two LC tanks, for example, a first LC tank 110 and a second LC tank 120, and further includes a phase detector 310 and a controller 320 as the startup circuit.

Clocks having a phase difference of ±90°, for example, CLK0, CLK90, CLK180 and CLK270 are generated from output terminals of the first LC tank 110 and output terminals of the second LC tank 120, respectively. Here, the phase difference between the clocks CLK0 and CLK90 becomes one of +90° and −90° according to the operation mode of the LC quadrature VCO.

In particular, the phase detector 310 is connected to all of the output terminals of the first LC tank 110 and the second LC tank 120 for receiving the clocks CLK0, CLK90, CLK180 and CLK270 from the first LC tank 110 and the second LC tank 120. As another embodiment, it may be designed that the phase detector 310 is connected to the (+) output terminal of the first LC tank 110 and the (−) output terminal of the second LC tank 120 for receiving only the two clocks, for example, CLK0 and CLK90, instead of receiving all of the clocks.

This phase detector 310 receives the clocks generated by the first LC tank 110 and the second LC tank 120, and detects whether the phase difference between the clocks is +90° or −90°, that is, detects phase information.

Next, the phase detector 310 delivers the phase information detection result to the controller 320. When the phase difference between the clocks is +90°, the phase detector 310 sets the phase information as '1' and inputs the same to the controller 320. When the phase difference between the clocks is −90°, the phase detector 310 sets the phase information as '0' and inputs it to the controller 320. That is, it can be seen that when the phase information outputted from the phase detector 310 is '1', the operation mode of the LC quadrature VCO generates the clocks so that the phase difference therebetween is +90°, and when the phase information outputted from the phase detector 310 is '0', the operation mode of the LC quadrature VCO generates the clocks so that the phase difference therebetween is −90°.

In addition, the phase detector 310 may be designed to set the phase information as '0' when the phase difference between the clocks is +90°, and to set the phase information as '1' when the phase difference between the clocks is −90°.

On the other hand, the controller 320 receives the phase information having '0' or '1' from the phase detector 310. In a state that the controller 320 recognizes whether the phase difference between the clocks is +90° or −90° depending on the phase information, it discriminates whether the phase difference is equivalent to the phase difference between the clocks required by the clock recovery circuit, the data recovery circuit and the image rejection circuit. That is, the controller 320 discriminates whether the clocks having the desired phase difference have been generated by the LC quadrature VCO, and changes the operation mode of the LC quadrature VCO on the basis of the discrimination result of the phase difference between the clocks.

For example, in order to generate the clocks having the phase difference required by the clock recovery circuit, the data recovery circuit and the image rejection circuit, the controller 320 changes the operation mode of the LC quadrature VCO by turning on/off both the first LC tank 110 and the second LC tank 120, or any one of the first LC tank 110 and the second LC tank 120.

As described above, the first LC tank 110 and/or the second LC tank 120 randomly reselect the operation mode whenever they are turned off and on in response to a control signal (a turning on/off signal) of the controller 320. The phase difference between the clocks generated by the first LC tank 110 and the second LC tank 120 is repeatedly detected and discriminated. Through such repetitive detection and discrimination operations, if the clocks having the desired phase difference are generated by the LC quadrature VCO, the control operation is stopped.

Now, details of the phase detector 310 and the controller 320 will be given with reference to FIGS. 4 and 5.

Figure 4:
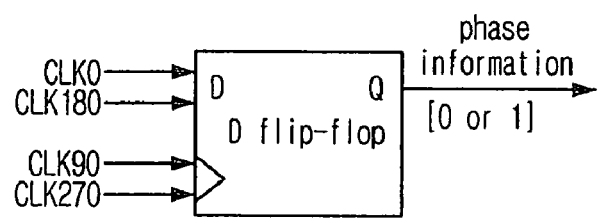
FIG. 4 is a detailed circuit diagram of the phase detector depicted in FIG. 3.

FIG. 4 illustrates a detailed circuit diagram of the phase detector 310 shown in FIG. 3.

As depicted in FIG. 4, the phase detector 310 can be implemented by using a D flip-flop.

The phase detector 310 shown in FIG. 4 is a differential D flip-flop that takes all of the clocks CLK0, CLK90, CLK180 and CLK270. As another embodiment, the phase detector 310 may be implemented by a single-ended D flip-flop accepting the clocks CLK0 and CLK90. Also, the phase detector 310 may be embodied by using a Complementary Metal Oxide Semiconductor (CMOS) logic circuit or a Current Mode Logic (CML) circuit depending on an operation speed of clock signals to be phase-detected.

Figure 5:
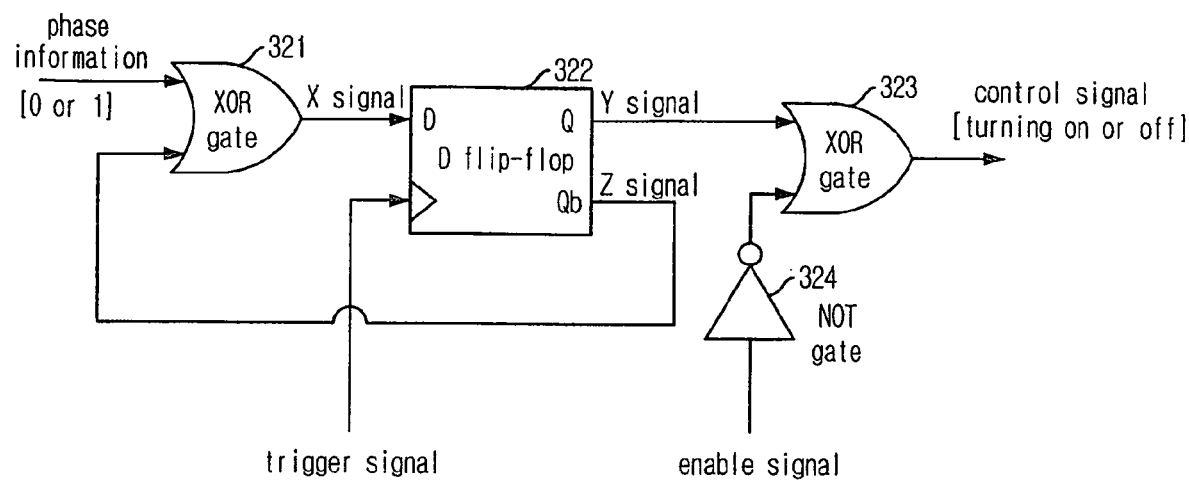
FIG. 5 is a detailed circuit diagram of the controller shown in FIG. 3.

FIG. 5 illustrates a detailed circuit diagram of the controller 320 depicted in FIG. 3.

As shown in FIG. 5, the controller 320 of the present invention includes two XOR gates, for example, a first XOR gate 321 and a second XOR gate 323, one D flip-flop 322, and one NOT gate (inverter) 324.

In the controller 320 shown in FIG. 5, the phase information (0 or 1) outputted from the phase detector 310 is inputted to one of input terminals of the first XOR gate 321, a Z signal outputted from one of output terminals of the D flip-flop 322 is inputted to the other of the input terminals of the first XOR gate 321, an X signal outputted from an output terminal of the first XOR gate 321 and a trigger signal are inputted to input terminals of the D flip-flop 322, and a Y signal outputted from one of output terminals of the D flip-flop 322 is inputted to one of input terminals of the second XOR gate 323. The second XOR gate 323 receiving an enable signal from the NOT gate 324 and the Y signal from the D flip-flop 322 outputs the control signal (LC tank turning on/off) to the first LC tank 110 and/or the second LC tank 120 through its output terminal.

The controller 320 illustrated in FIG. 5 may be implemented by properly combining other logic gates well known in the art. For example, three NOT gates coupled in series may be embodied to perform the function of one NOT gate, or an NOT gate and a NOR gate coupled in series may be embodied to perform the function of one OR gate.

Now, the input/output signal relationship in each of the phase detector 310 illustrated in FIG. 4 and the controller 320 illustrated in FIG. 5 will be described with reference to FIGS. 6 and 7.

Figure 6:
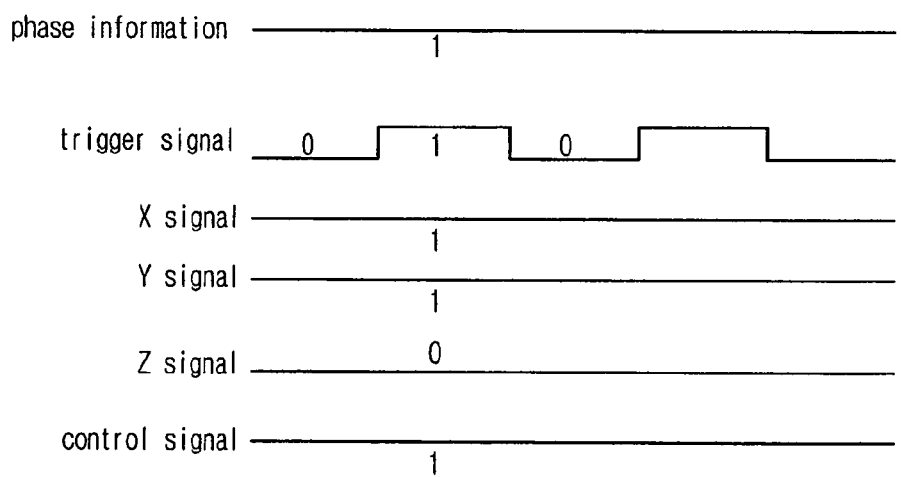
FIGS. 6 and 7 are waveform diagrams describing input and output signals conducted in the controller shown in FIG. 5.
Figure 7:
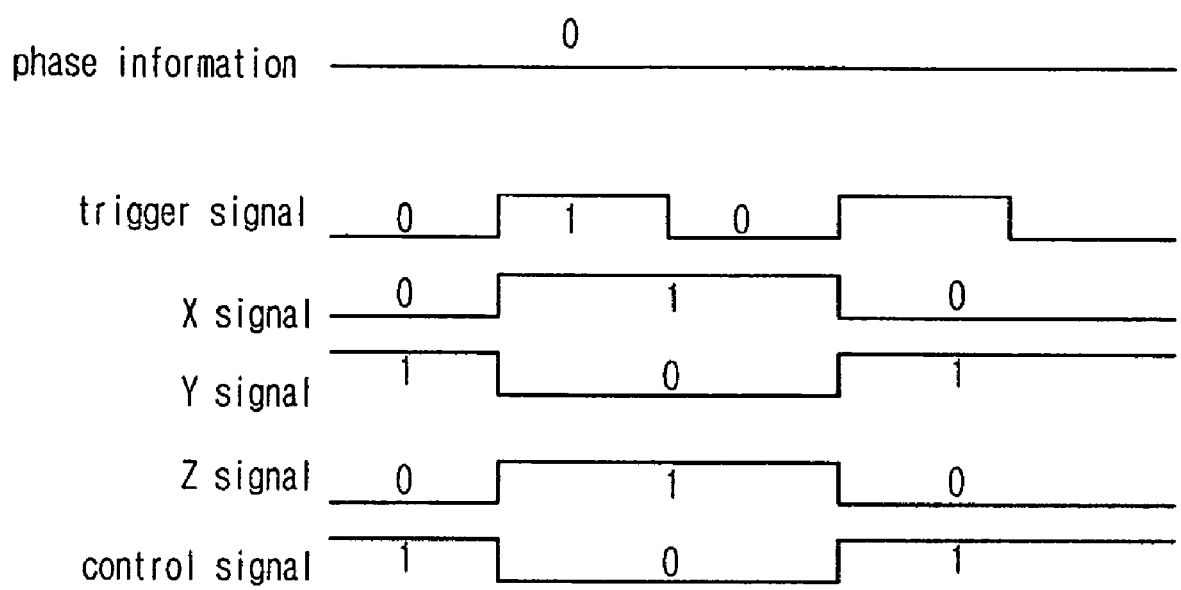

FIGS. 6 and 7 are waveform diagrams showing the input and output signals in the controller 320 of FIG. 5. That is, FIG. 6 shows a case where the phase detector 310 inputs the phase information '1' to the controller 320, and FIG. 7 represents a case where the phase detector 310 inputs the phase information '0' to the controller 320.

Referring to FIG. 6, when the phase detector 310 outputs the phase information '1', the operation mode of the LC quadrature VCO becomes a desired operation mode. In this case, the controller 320 always outputs the control signal '1' for controlling the LC tanks 110 and 120, regardless of the trigger signal. Therefore, both the first LC tank 110 and the second LC tank 120 maintain the turning on state.

On the contrary, as shown in FIG. 7, when the phase detector 310 outputs the phase information '0', the operation mode of the LC quadrature VCO becomes an undesired operation mode. In this case, the controller 320 varies the control signal depending on a variation of the trigger signal as follows: '1'=>'0'=>'1'; and outputs the varied control signal to the LC tanks 110 and 120. Accordingly, the first LC tank 110 and/or the second LC tank 120 is alternately turned on/off.

Although the first LC tank 110 and/or the second LC tank 120 is alternately turned on/off, if the phase information from the phase detector 310 is continuously maintained as '0', the controller 320 repeatedly outputs the control signal as '1'=>'0'=>'1'=>'0' according to the variation of the trigger signal. That is, the controller 320 repeats the above procedure until the phase difference between the clocks generated by the first LC tank 110 and/or the second LC tank 120 becomes the desired phase difference of either +90° or −90°. In other words, it halts the procedure when the phase information from the phase detector 310 becomes '1'.

As set forth above, in accordance with the present invention, one of +90° and −90° can be accurately selected as a phase difference between two clocks generated by an LC quadrature VCO.

In addition, the present invention can embody a startup circuit in the LC quadrature VCO by using low cost circuit devices, thereby controlling the dual operation modes of the LC quadrature VCO. Also, the present invention has an advantage in that the startup circuit can be easily integrated in the LC quadrature VCO with general LC tanks.

Furthermore, the present invention can allow the LC quadrature VCO to accurately generate the phase difference between clocks required by a signal processing unit such as a clock recovery circuit, a data recovery circuit, an image rejection circuit or the like, thus ensuring the normal operation of the signal processing unit.

The present application contains subject matter related to Korean patent application No. 2006-0095677, filed with the Korean Intellectual Property Office on Sep. 29, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An Inductor-Capacitor (LC) quadrature Voltage Controlled Oscillator (VCO) having a startup circuit for providing clock signals having a phase difference of ±90° to an external signal processing unit, comprising:
   a first LC tank for generating a second clock signal and a fourth clock signal;
   a second LC tank for generating a first clock signal and a third clock signal;
   a phase detector for receiving the clock signals from the first LC tank and the second LC tank, and detecting whether a phase difference between the clocks is +90° or −90°; and
   a controller for discriminating whether phase information detected by the phase detector is equivalent to a phase difference between clocks required by the external signal processing unit, and changing an operation mode of the first LC tank and/or the second LC tank on the basis of the discrimination result of the phase difference between the clocks.

2. The LC quadrature VCO as recited in claim 1, wherein when the phase difference between the clocks is +90°, the phase detector sets the phase information as '1' and inputs the phase information to the controller, and when the phase difference between the clocks is −90°, the phase detector sets the phase information as '0' and inputs the phase information to the controller.

3. The LC quadrature VCO as recited in claim 1, wherein the phase detector is designed to be connected to each of output terminals of the first LC tank and the second LC tank, or to be connected to the (+) output terminal of the first LC tank and the (−) output terminal of the second LC tank.

4. The LC quadrature VCO as recited in claim 2, wherein the controller inputs a turning on/off signal to the first LC tank and/or the second LC tank to change the operation mode of generating the clock signals in the first LC tank and/or the second LC tank.

5. The LC quadrature VCO as recited in claim 4, wherein the controller alternately inputs the turning on signal and the turning off signal to the first LC tank and/or the second LC tank, and stops inputting the turning on/off signal when the phase information detected by the phase detector is equivalent to the phase difference between the clocks required by the external signal processing unit.

6. The LC quadrature VCO as recited in claim 1, wherein the phase detector is implemented by using a D flip-flop receiving the first clock signal, the second clock signal, the third clock signal and the fourth clock signal, or a D flip-flop receiving the first clock signal and the second clock signal, or a Complementary Metal Oxide Semiconductor (CMOS) logic circuit or a Current Mode Logic (CML) circuit depending on an operation speed of the clock signals.

7. The LC quadrature VCO as recited in claim 1, wherein the controller is provided with two XOR gates, one D flip-flop and one NOT gate.

* * * * *